United States Patent
Wu et al.

(10) Patent No.: US 7,701,708 B2
(45) Date of Patent: Apr. 20, 2010

(54) HEAT DISSIPATION ASSEMBLY

(75) Inventors: Hung-Yi Wu, Taipei Hsien (TW); Zhen-Xing Ye, Shenzhen (CN); Ke Sun, Shenzhen (CN); Ming-Ke Chen, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei, Hsien (TW)

( * ) Notice: Subject to any disclaimer, the term of this patent is extended or adjusted under 35 U.S.C. 154(b) by 182 days.

(21) Appl. No.: 11/861,301

(22) Filed: Sep. 26, 2007

(65) Prior Publication Data

US 2008/0192427 A1 Aug. 14, 2008

(30) Foreign Application Priority Data

Feb. 8, 2007 (CN) .................. 2007 1 0200172

(51) Int. Cl.
| | |
|---|---|
| H05K 5/00 | (2006.01) |
| H05K 7/20 | (2006.01) |
| H01L 23/495 | (2006.01) |
| G06F 1/20 | (2006.01) |
| F28F 7/00 | (2006.01) |

(52) U.S. Cl. .................. 361/679.47; 361/679.48; 361/679.54; 361/695; 361/697; 361/702; 361/703; 361/709; 257/675; 165/80.3; 165/185; 174/15.2

(58) Field of Classification Search .................. 361/687
See application file for complete search history.

(56) References Cited

U.S. PATENT DOCUMENTS

| 4,204,246 | A | * | 5/1980 | Arii et al. .................. 361/699 |
|---|---|---|---|---|
| 4,695,924 | A | * | 9/1987 | Wozniczka .................. 361/720 |
| 5,339,214 | A | * | 8/1994 | Nelson .................. 361/695 |
| 5,549,155 | A | * | 8/1996 | Meyer et al. .......... 165/104.33 |
| 5,598,320 | A | * | 1/1997 | Toedtman et al. ...... 361/679.47 |
| 5,826,645 | A | * | 10/1998 | Meyer et al. .......... 165/104.33 |
| 5,959,837 | A | * | 9/1999 | Yu .................. 361/697 |
| 6,043,980 | A | * | 3/2000 | Katsui .................. 361/695 |
| 6,088,223 | A | * | 7/2000 | Diemunsch .................. 361/690 |
| 6,137,683 | A | * | 10/2000 | Lee et al. .................. 361/704 |
| 6,166,907 | A | * | 12/2000 | Chien .................. 361/699 |
| 6,276,448 | B1 | * | 8/2001 | Maruno .................. 165/185 |
| 6,333,850 | B1 | * | 12/2001 | Pei et al. .................. 361/695 |
| 6,352,103 | B1 | * | 3/2002 | Chu et al. .................. 165/80.3 |
| 6,359,780 | B1 | * | 3/2002 | McMahan et al. ...... 361/679.47 |
| 6,407,916 | B1 | * | 6/2002 | Konstad .................. 361/679.47 |
| 6,418,018 | B1 | * | 7/2002 | Lo .................. 361/700 |
| 6,542,364 | B2 | * | 4/2003 | Lai et al. .................. 361/697 |

(Continued)

FOREIGN PATENT DOCUMENTS

CN 2580507 Y 10/2003

*Primary Examiner*—Jayprakash N Gandhi
*Assistant Examiner*—Bradley H Thomas
(74) *Attorney, Agent, or Firm*—Frank R. Niranjan

(57) ABSTRACT

A heat dissipation assembly for dissipating heat from a heat-generating component includes a first heat sink mounted on the heat-generating component for dissipating heat therefrom, and a second heat sink movably mounted to the first heat sink, to be adjustable relative to the first heat sink. The second heat sink can be moved to a desired position to fit a need of heat dissipation.

14 Claims, 5 Drawing Sheets

U.S. PATENT DOCUMENTS

| | | | |
|---|---|---|---|
| 6,708,754 B2 * | 3/2004 | Wei | 165/46 |
| 6,771,497 B2 * | 8/2004 | Chen et al. | 361/679.47 |
| 6,778,394 B2 * | 8/2004 | Oikawa et al. | 361/700 |
| 6,779,595 B1 * | 8/2004 | Chiang | 165/104.33 |
| 6,883,594 B2 * | 4/2005 | Sarraf et al. | 165/104.33 |
| 6,940,717 B2 * | 9/2005 | Shih-Tsung | 361/695 |
| 6,964,295 B1 * | 11/2005 | Yu et al. | 165/104.33 |
| 6,989,990 B2 * | 1/2006 | Malone et al. | 361/699 |
| 7,167,367 B2 * | 1/2007 | Zhang | 361/704 |
| 7,277,282 B2 * | 10/2007 | Tate | 361/697 |
| 7,325,590 B2 * | 2/2008 | Kim et al. | 165/104.33 |
| 7,385,818 B2 * | 6/2008 | Heesen | 361/700 |
| 7,440,279 B2 * | 10/2008 | Lai et al. | 361/700 |
| 7,447,017 B2 * | 11/2008 | Koo | 361/688 |
| 7,447,025 B2 * | 11/2008 | Chen et al. | 361/696 |
| 7,474,527 B2 * | 1/2009 | Wu | 165/104.33 |
| 7,477,515 B2 * | 1/2009 | Tsai et al. | 361/700 |
| 7,542,293 B2 * | 6/2009 | Zhao et al. | 361/700 |
| 2003/0019607 A1 * | 1/2003 | Wei | 165/46 |
| 2004/0123978 A1 * | 7/2004 | Hashimoto et al. | 165/80.3 |
| 2004/0188080 A1 * | 9/2004 | Gailus et al. | 165/185 |
| 2004/0246677 A1 * | 12/2004 | Chen | 361/697 |
| 2005/0135063 A1 * | 6/2005 | Heesen | 361/700 |
| 2005/0243514 A1 * | 11/2005 | Malone et al. | 361/697 |
| 2005/0257532 A1 * | 11/2005 | Ikeda et al. | 62/3.7 |
| 2006/0087811 A1 * | 4/2006 | He | 361/687 |
| 2006/0181850 A1 * | 8/2006 | Frank et al. | 361/700 |
| 2008/0007915 A1 * | 1/2008 | Chen | 361/701 |
| 2008/0084669 A1 * | 4/2008 | Xia et al. | 361/704 |
| 2008/0180915 A1 * | 7/2008 | Lin | 361/704 |

* cited by examiner

HEAT DISSIPATION ASSEMBLY

BACKGROUND

1. Field of the Invention

The present invention relates to heat dissipation assemblies, and particularly to a heat dissipation assembly attached to a central processing unit (CPU).

2. Description of Related Art

Advances in microelectronics technology have led to computers processing signals and data at unprecedented high speeds. During operation large amounts of heat are produced by heat-generating components, especially by a CPU of a motherboard, in computers. Thus, heat dissipation assemblies are needed to cool CPUs. Generally, a heat dissipation assembly and a system fan are installed separately, however, this arrangement is not the most efficient to cool a CPU.

What is desired, therefore, is a heat dissipation assembly which provides high efficiency of heat dissipation for a CPU.

SUMMARY

An exemplary heat dissipation assembly for dissipating heat from a heat-generating component includes a first heat sink mounted on the heat-generating component for dissipating heat therefrom, and a second heat sink movably mounted to the first heat sink, to be adjustable relative to the first heat sink.

Other advantages and novel features will become more apparent from the following detailed description when taken in conjunction with the accompanying drawings, in which:

DETAILED DESCRIPTION

Figure 1:
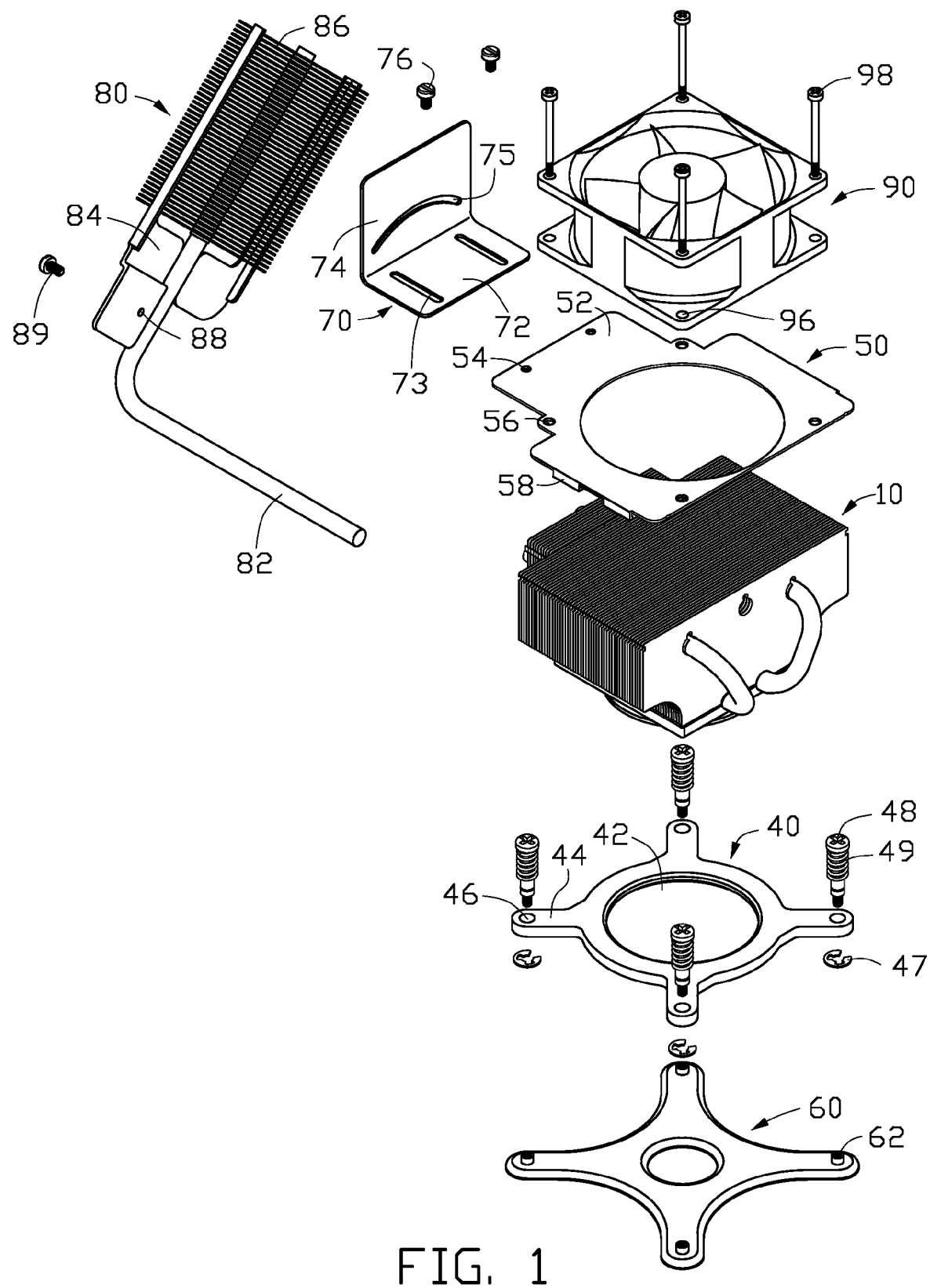
FIG. 1 is an exploded, isometric view of a heat dissipation assembly in accordance with an embodiment of the present invention, the heat dissipation assembly includes a first heat sink and a second heat sink.

Referring to FIG. 1, a heat dissipation assembly in accordance with an embodiment of the present invention includes a fan 90, a first heat sink 10, a second heat sink 80, a securing board 50, a mounting board 70, a clip 40, and a fixing board 60.

The fan 90 defines four pairs of through holes 96 in four corners thereof respectively.

Figure 2:
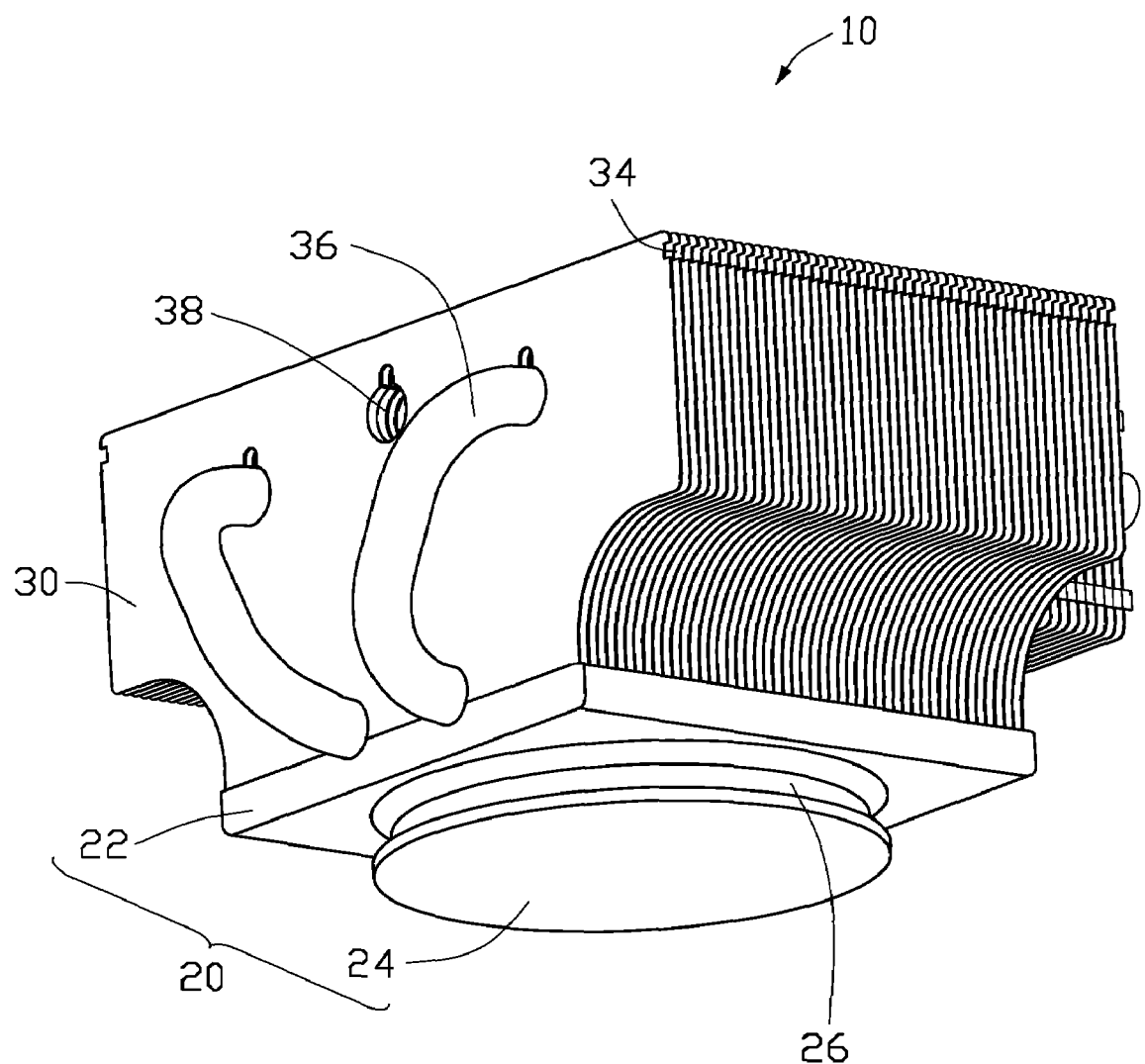
FIG. 2 is an inverted isometric view of the first heat sink of FIG. 1.

Referring also to FIG. 2, the first heat sink 10 includes a base 20 for contacting a heat-generating component, such as a CPU of a motherboard 6 (see FIG. 5) in the present embodiment, to transfer heat therefrom, and a first finned part including a plurality of fins 30 connected with the base 20. The base 20 includes a rectangular supporting part 22, and a circular shaped connecting part 24 extending down from a bottom face of the supporting part 22. An annular groove 26 is defined in a circumference of the connecting part 24. The fins 30 of the first finned part are parallel and extending perpendicularly from a top surface of the supporting part 22. Two slots 34 are respectively defined in an upper portion of the first finned part at opposite ends of the fins 30. Two C-shaped heat pipes 36 are inserted in the first heat sink 10, with middle portions thereof exposed at a side of the heat sink 10. An end of each heat pipe 36 passes through the upper portion of the first finned part and an opposite end of each pipe 36 passes through a junction of the first finned part and the base 20, which enhances heat exchange between the first finned part and the base 20. A through hole 38 is defined in the upper portion of the first heat sink 10 between the two heat pipes 36, extending from one side of the heat sink 10 to the other.

Referring also to FIG. 1, the second heat sink 80 includes a heat-dissipating part and a heat-conducting part. The heat-dissipating part includes a U-shaped bracket 84 with two arms, and a second finned part including a plurality of parallel fins 86, which is perpendicularly fixed to the two arms of the bracket 84. A mounting hole 88 is defined in a lower portion of the bracket 84. The heat-conducting part includes an L-shaped heat pipe 82. One end of the heat pipe 82 passes through the fins 86 of the second finned part between the two arms of the bracket 84, the other end of the heat pipe 82 is configured for engaging with the through hole 38 of the first heat sink 10.

The securing board 50 includes a plurality of L-shaped hooks 58 extending down from opposite ends thereof. An opening (not labeled) is defined in a center of the securing board 50, corresponding to the fan 90. Four mounting holes 56 are respectively defined in four corners of the securing board 50, corresponding to the through holes 96 of the fan 90. A tongue 52 extends out from a side of the securing board 50. Two holes 54 are defined in a distal end of the tongue 52.

The mounting board 70 includes a rectangular horizontal piece 72, and a rectangular vertical piece 74 extending form a side of the horizontal piece 72. Two parallel sliding slots 73 are defined in the horizontal piece 72 corresponding to the two holes 54 of the securing board 50, and perpendicular to the vertical piece 74. An arc-shaped slot 75 is defined in the vertical piece 74.

The clip 40 includes a ring-shaped main portion and four projecting portions 44 extending out from an outer side of the main portion. A mounting hole 42 is defined in a center of the main portion. A locking hole 46 is defined in each projecting portion 44, with a fastening unit engaged therein. The fastening unit includes a screw 48 inserted in the locking hole 46, a spring 49 fitting about the screw 48 and located upon the projecting portion 44, and a clasp 47 clipped around the screw 48 and located under the projecting portion 44 for preventing the screw 48 from disengaging from the locking hole 46.

The fixing board 60 is generally cross-shaped, with an opening defined in a center and four locking holes 62 respectively defined in four ends thereof.

Figure 3:
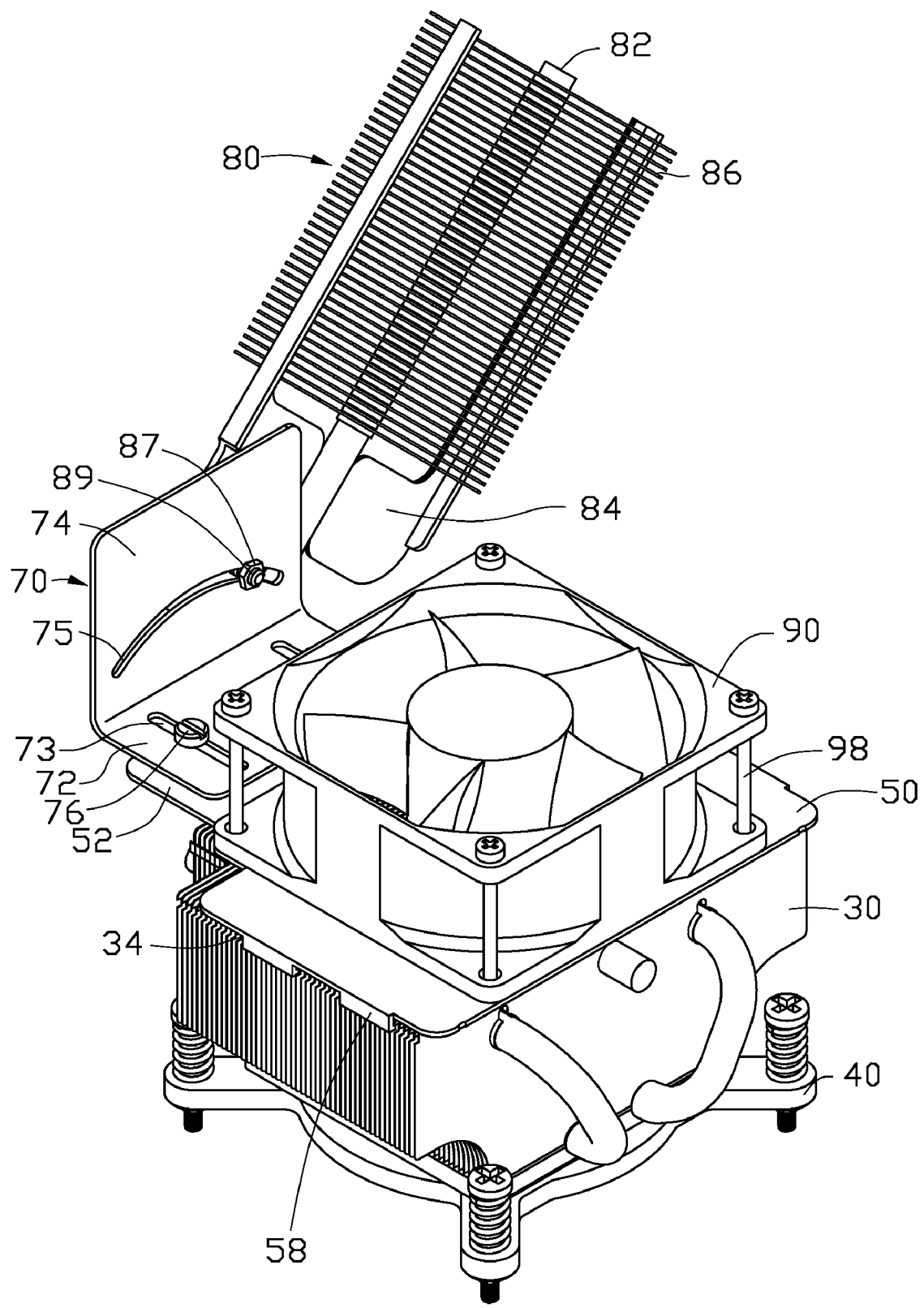
FIG. 3 is an assembled view of FIG. 1.
Figure 4:
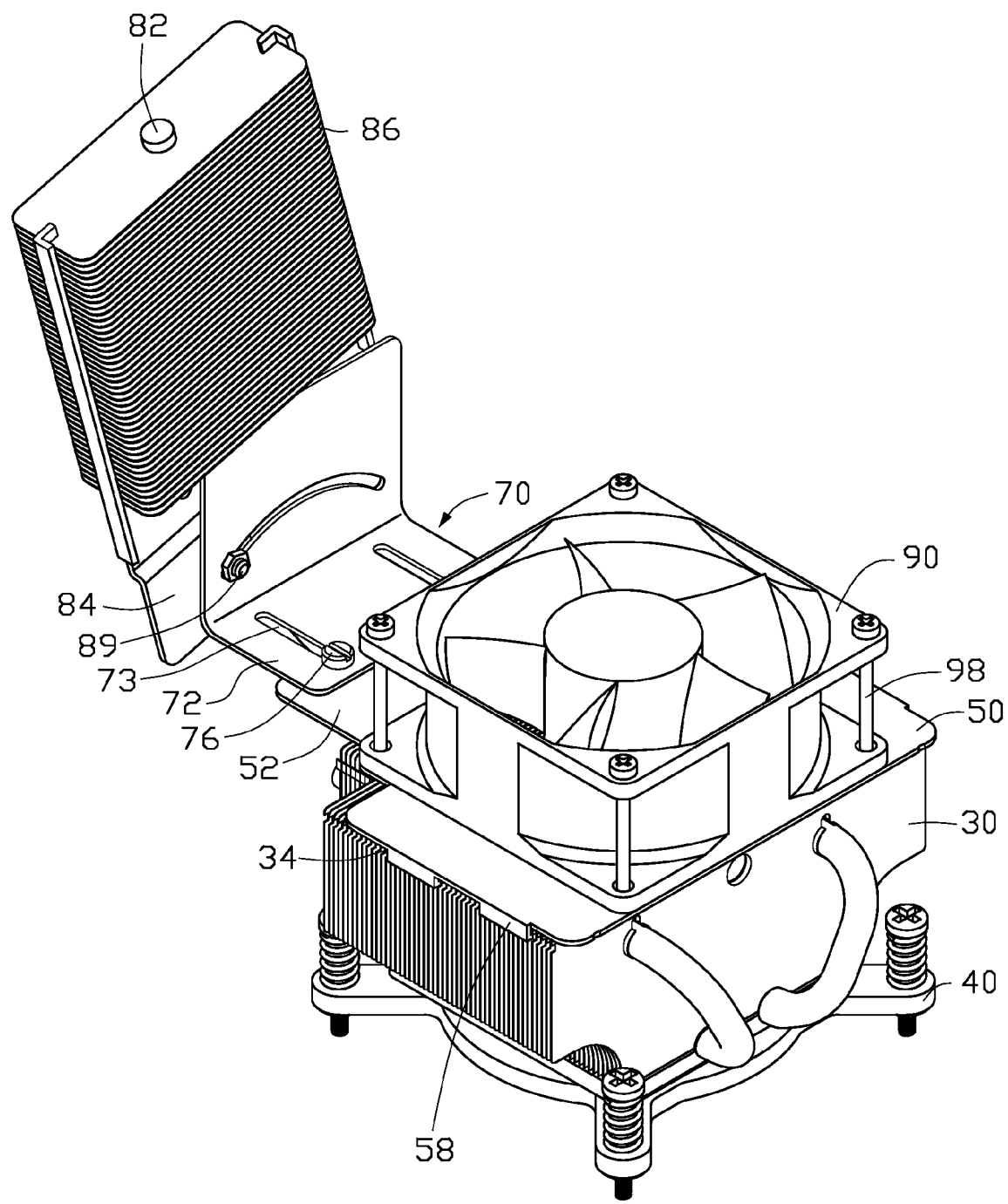
FIG. 4 is similar to FIG. 3, but showing the second heat sink in a different position.

Referring also to FIGS. 3 and 4, in assembly, four screws 98 are inserted through the corresponding through holes 96 of the fan 90 and screwed in the corresponding mounting holes 56 of the securing board 50, in order to assemble the fan 90 and the securing board 50 together. The hooks 58 of the securing board 50 are correspondingly engaged in the slots 34 of the first finned part of the first heat sink 10 to combine the securing board 50 to the heat sink 10. Two screws 76 are inserted through the corresponding sliding slots 73 of the mounting board 70 and then engaged in the corresponding holes 54 of the tongue 52 of the securing board 50. Thus, the mounting board 70 is slidably mounted to the securing board 50. Note here that the axis of the camber slot 75 of the moving board 70 should be the same as the axis of the through hole 38 of the first heat sink 10. The end, away from the fins 86, of the heat pipe 82 is slidably and rotatably inserted in the through hole 38 of the first heat sink 10. A screw 89 is inserted through the mounting hole 88 of the second heat sink 80 and the slot 75, to engage with a screw nut 87. Thus, the second heat sink 80 is slidably mounted to the mounting board 70 and pivotable relative to the first heat sink 10 about the axis of the through hole 38 of the first heat sink 10. A wall bounding the mounting hole 42 of the clip 40 is snappingly clipped in the groove 26 of the base 20 of the first heat sink 10. The fixing board 60 is attached to a bottom of the motherboard 6, and the connecting part 24 of the heat sink 10 is placed upon the CPU of the motherboard 6. Four holes are defined through the motherboard 6 around the CPU. The screws 48 of the clip 40 are inserted through the corresponding holes of the motherboard 6 and engaged in the corresponding locking holes 62 of the fixing board 60. Thus, the heat dissipation assembly is mounted to the motherboard 6.

Figure 5:
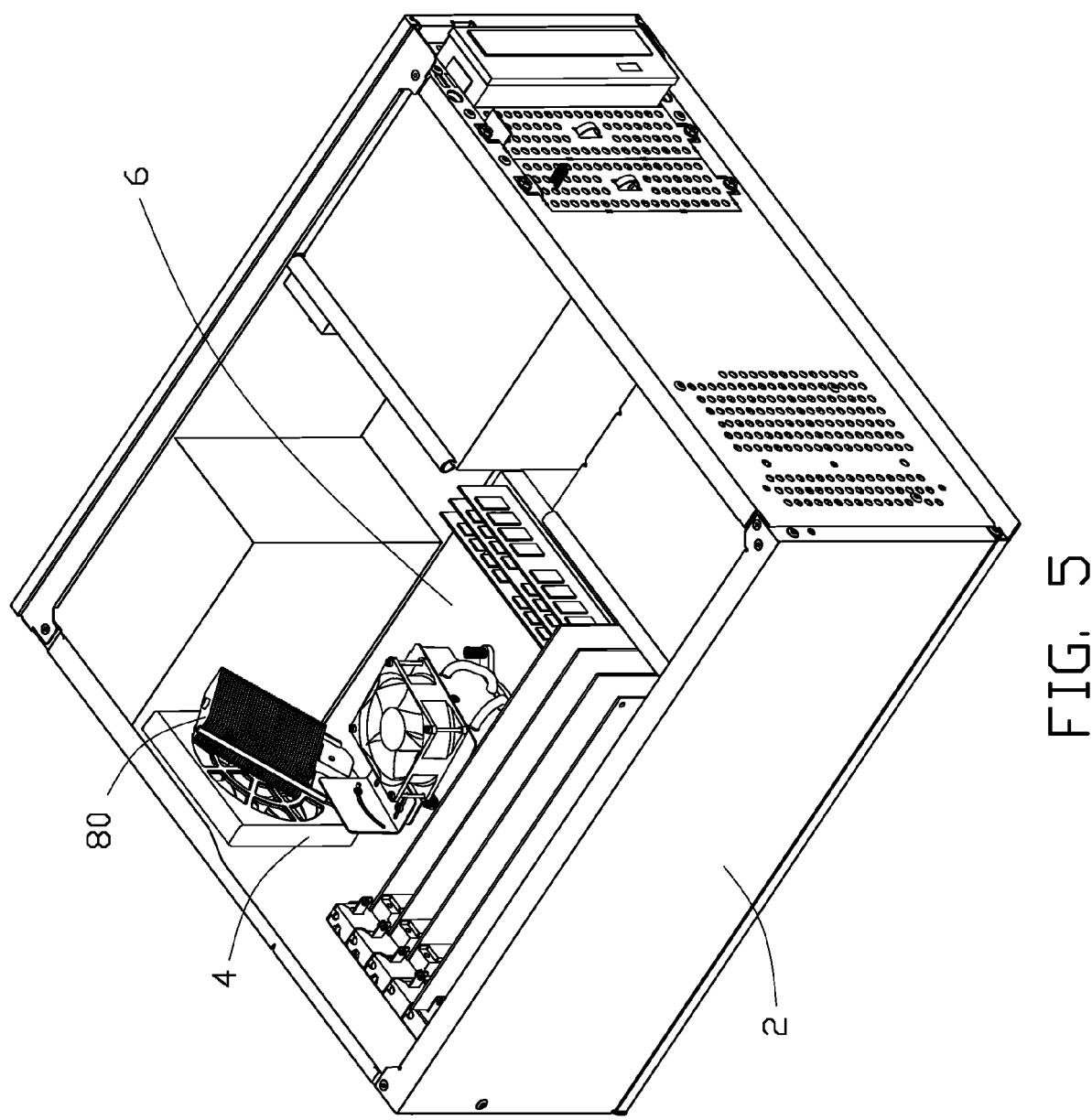
FIG. 5 is an assembled, isometric view of the heat dissipation assembly of FIG. 3 and a host computer.

Referring also to FIG. 5, in use, the clip 40 and the fixing board 60 are mounted to the motherboard 6 that is mounted to a sidewall of a host computer 2 and sandwich the motherboard 6 therebetween, with the second finned part of the second heat sink 80 aligning with a system fan 4 that is mounted to a rear wall of the host computer 2. When a distance between the system fan 4 and the second finned part of the second heat sink 80 needs to be adjusted, the two screws 76 are loosened, the mounting board 70 together with the second heat sink 80 is moved relative to the first heat sink 10, the screws 76 slide in the corresponding sliding slots 73 of the mounting plate 70 and the heat pipe 82 of the second heat sink 80 slides in the through hole 38 of the first heat sink 30, until the second heat sink 80 is located at a desired position. The screws 76 are tightly screwed into the corresponding holes 54 of the securing plate 50 to locate the mounting plate 70. The second finned part of the second heat sink 80 is aligned with the system fan 4, by loosening the screw nut 87 for the screw 89 and rotating the second heat sink 80. The screw 89 slides in the slot 75 and the heat pipe 82 of the second heat sink 80 rotates in the through hole 38 of the first heat sink 30, until the second finned part of the second heat sink 80 aligns with the system fan 4, then the screw 89 is tightly engaged with the screw nut 87. If needed, the screws 76 and the screw nut 87 can be loosened together, and the second heat sink 80 can be synchronously slid and rotated.

It is believed that the present embodiment and its advantage will be understood from the foregoing description, and it will be apparent that various changes may be made thereto without departing from the spirit and scope of the invention or sacrificing all of its material advantages, the examples hereinbefore described merely being exemplary embodiment of the invention.

What is claimed is:

1. A heat dissipation assembly for dissipating heat from a heat-generating component, comprising:
   a first heat sink mounted on the heat-generating component for dissipating heat therefrom;
   a securing board fixed to the first heat sink;
   a mounting board slidably mounted to the securing board; and
   a second heat sink movably mounted to the first heat sink and rotatably mounted to the mounting board, to be adjustable relative to the first heat sink,
   wherein the mounting board comprises a first piece with two sliding slots slidably mounted to the securing board via the two sliding slots, and a second piece with an arc-shaped slot perpendicular to the first piece and rotatably engaged with the second heat sink via the arc-shaped slot.

2. The heat dissipation assembly as claimed in claim 1, wherein a hole is defined in the first heat sink, and the second heat sink comprises a heat-conducting part which is slidably and rotatably inserted in the hole and conducts heat between the first heat sink and the second heat sink.

3. The heat dissipation assembly as claimed in claim 2, wherein the heat-conducting part comprises an L-shaped heat pipe, and one end of the heat pipe is slidably and rotatably received in the hole of the first heat sink and an opposite end of the heat pipe is secured to the second heat sink.

4. The heat dissipation assembly as claimed in claim 3, wherein the second heat sink further comprises a heat-dissipating part fixed along the opposite end of the heat pipe.

5. The heat dissipation assembly as claimed in claim 4, wherein the heat-dissipating part comprises a plurality of parallel fins, the opposite end of the heat pipe perpendicularly extending through the fins.

6. The heat dissipation assembly as claimed in claim 2, wherein the arc-shaped slot having the same axis as an axis of the hole of the first heat sink is defined in the second piece of the mounting board, a mounting hole is defined in the heat-dissipating part of the second heat sink, a screw is inserted through the mounting hole of the heat-dissipating part and the arc-shaped slot, to engage with a screw nut to rotatably mount the second heat sink to the mounting board.

7. The heat dissipation assembly as claimed in claim 2, wherein the securing board is fixed to a top of the first heat sink, wherein the two sliding slots perpendicular to the second piece are defined in the first piece of the mounting board, a tongue-shaped portion extends from a side of the securing board, two holes are defined in a free side of the tongue-shaped portion, two screws are respectively inserted through the corresponding sliding slots of the mounting board and engaged in the corresponding holes of the tongue-shaped portion to slidably mount the mounting board to the securing board.

8. A computer system comprising:
   a host computer, comprising a motherboard mounted to a sidewall thereof with a heat-generating component mounted thereon, and a system fan mounted to a rear wall thereof configured for dissipating heat for the host computer;
   a first heat sink mounted to the heat-generating component;
   a securing board fixed to the first heat sink;
   a mounting board slidably mounted to the securing board; and
   a second heat sink connected to the first heat sink to conduct heat from the first heat sink, the second heat sink comprising a heat-dissipating part cooled by the system fan, the second heat sink being movably mounted to the first heat sink and rotatably mounted to the mounting board such that the heat-dissipating part of the second heat sink is adjustable relative to the system fan;
   wherein the mounting board comprises a first piece with two sliding slots slidably mounted to the securing board via the two sliding slots, and a second piece with an arc-shaped slot perpendicular to the first piece for rotatably mounting the heat-dissipating part of the second heat sink via the arc-shaped slot.

9. The system as claimed in claim 8, wherein the second heat sink further comprises a heat-conducting part secured to the heat-dissipating part, the heat-conducting part is slidably and rotatably mounted to the first heat sink.

10. The system as claimed in claim 9, wherein a hole is defined in the first heat sink, the heat-conducting part is slidably and rotatably inserted in the hole.

11. The system as claimed in claim 10, wherein the heat-conducting part comprises an L-shaped heat pipe, one end of the heat pipe is slidably and rotatably received in the hole of the first heat sink, the other end of the heat pipe is fixed to the heat-dissipating part.

12. The system as claimed in claim 10, wherein the arc-shaped slot, with the same axis as an axis of the hole of the first heat sink, is defined in the second piece of the mounting board, a mounting hole is defined in the heat-dissipating part of the second heat sink, a screw is inserted through the mounting hole of the second heat sink and the arc-shaped slot to rotatably mount the heat-dissipating part to the second piece.

13. The system as claimed in claim 12, wherein the securing board is fixed to a top of the first heat sink, wherein the two sliding slots perpendicular to the second piece are defined in the first piece of the mounting board, a tongue-shaped portion is extended from a side of the securing board, two holes are defined in a free end of the tongue-shaped portion, two screws are respectively inserted through the corresponding sliding slots to engage in the corresponding holes of the securing board.

14. A computer system comprising:
a host computer comprising a plurality of walls, a circuit board mounted to one of the walls, and a system fan mounted to another one of the walls configured to dissipate heat for the host computer, a heat-generating component being mounted on the circuit board;
a first heat sink mounted to the heat-generating component; and
a second heat sink comprising a heat pipe and a plurality of fins attached around one end of the heat pipe and cooled by the system fan, an opposite end of the heat pipe slidably and rotatably inserted into the first heat sink to conduct heat from the first heat sink to the fins of the second heat sink, the fins of the second heat sink being adjustable relative to the system fan via adjusting the opposite end of the heat pipe relative to the first heat sink;
wherein a mounting board is slidably mounted to the first heat sink, wherein one of the second heat sink and the mounting board defines an arc-shaped slot, a connecting structure extending from the other of the second heat sink and the mounting board is slidably engaged in the arc-shaped slot to thereby rotatably mount the second heat sink to the mounting board;
wherein the first heat sink comprises a securing board configured to secure a fan thereon, one of the securing board and the mounting board defines a linear slot, another connecting structure extending from the other of the securing board and the mounting board is slidably engaged in the linear slot to thereby slidably mount the mounting board to the first heat sink.

* * * * *